May 29, 1962 E. LESHNER 3,037,181

ELECTRICAL CONNECTOR FOR CIRCUIT BOARD

Filed April 1, 1959

INVENTOR.
ERVIN LESHNER

BY Samuel Kane

ATTORNEY

United States Patent Office 3,037,181

Patented May 29, 1962

3,037,181

ELECTRICAL CONNECTOR FOR CIRCUIT BOARD

Ervin Leshner, Philadelphia, Pa., assignor to Burroughs Corporation, Detroit, Mich., a corporation of Michigan Filed Apr. 1, 1959, Ser. No. 803,450

7 Claims. (Cl. 339—17)

This invention relates generally to electrical and electronic apparatus and more particularly to connectors for interconnecting printed or etched circuit boards and like components in circuit with associated apparatus.

In the development of electronic components and equipment the need for improved reliability and more efficient utilization of space has received considerable attention. Presently known multiple contact connectors, for example, are not fully efficient because they depend upon the spring forces of the contacts for making and maintaining electrical contact, and accordingly their reliability is not of the highest order because of the limited force available. Furthermore, the particular structure of such connectors and the manner of their use in connection with printed circuit boards and other components for supporting such boards have heretofore required the use of a substantial portion of the printed circuit board which otherwise would have been available for additional circuitry and components.

For example, one known method of supporting a rectangular printed circuit board in circuit with a multiple contact connector has been by means of two fixed slides mounted in a chassis structure which supported the printed circuit board by two of its margins, while a third margin used for terminating the board conductors was plugged into the multiple contact connector. Thus by utilizing three of the four margins for such purposes, an appreciable portion of the board surface was rendered unavailable for additional circuitry or components.

An object of the invention is to provide an improved electrical connector whereby a printed circuit board or the like may be supported in circuit by a minimum of its surface area.

Another object of the invention is to provide an electrical connector whereby electrical contact may be obtained most reliably by the application of higher contact forces than heretofore obtainable.

A further object of the invention is to provide an electrical connector having a wiping contact as well as a high contact force.

Still a further object of the invention is to provide a multiple contact connector for easy plug-in insertion of printed circuit boards or the like without the possibility of abrading, nicking or otherwise damaging the board conductors or connector contacts during insertion or removal of the board from the connector.

Another object of the invention is to provide a fast-acting locking device for securing a printed circuit board or the like in circuit with a multiple contact connector whereby there is provided a vibration-proof assembly.

A further object of the invention is to provide improved plug-in and supporting means for printed circuit boards or the like whereby better utilization of the board surfaces is obtained for circuitry and components thus providing increased adaptability of the board to the use of high density packaging techniques.

These and other objectives will be more fully revealed in the following detailed description of specific embodiments of the invention when read in conjunction with the accompanying drawings in which.

Figure 1:
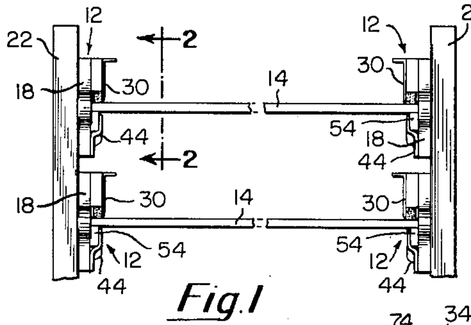
FIG. 1 illustrates several connectors constructed in accordance with the invention, and arranged in pairs with each pair supporting a printed circuit board in an electrical assembly.

Referring now to the drawings and particularly to FIG. 1, one form of electrical connectors 12 constructed in accordance with the invention are illustrated as arranged in pairs for supporting printed circuit boards 14 along opposite margins of the boards at which places the board conductors 16 (FIG. 3) are terminated. It is understood, as seen in FIG. 1, that the leftward connectors 12 may be designated left-hand in which case the opposite connectors 12 are right-hand. Except for the particular hand, that is left or right, the connectors are structurally the same. It is understood also that the particular arrangement of FIG. 1 is illustrative only and that the printed circuit boards 14 may each be supported by and connected to only one connector 12 in any particular assembly, if desired.

Each connector 12 comprises an insulating base panel 18 (FIG. 3) having fastening ears 20 at each end (FIG. 2) by means of which the connectors are secured to chassis strips 22 and 24 of the illustrated assembly as by screws 26. Secured to panel 18 is an elongated contact supporting bar 28 of insulating material which serves as a mounting for a plurality of spaced-apart conductive contact elements 30. Disposed along one side 32 of bar 28 is a strip 34 of resilient material, preferably rubber. The contacts 30 are secured to opposite faces 36 and 38 of bar 28 and are formed to embrace the resilient strip 34. The contacts are also drawn about bar 28 with sufficient tension as to compress the strip 34 and cause it to bulge as at 40, FIG. 5, somewhat beyond the faces 42 of contacts 30 in the direction toward the printed circuit board 14, as will be understood.

Figure 3:
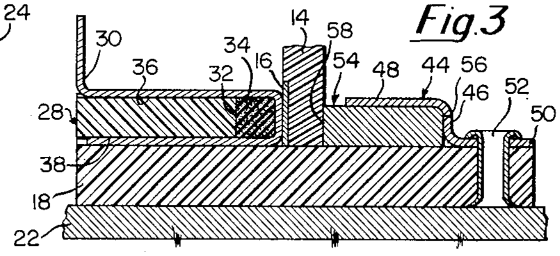
FIG. 3 is an enlarged sectional view taken along line 3—3 of FIG. 2 showing the method of locking the printed circuit board in electrical contact with the connector.

An elongated wedge guide 44 (FIGS. 2 and 3) is mounted on panel 18 and comprises a wall 46, an upper flange 48 extending leftwardly from wall 46 as seen in FIG. 3 and a lower flange 50 extending rightwardly. The wedge guide 44 is secured to panel 18 as by hollow rivets 52 extending through flange 50 and panel 18.

Figure 2:
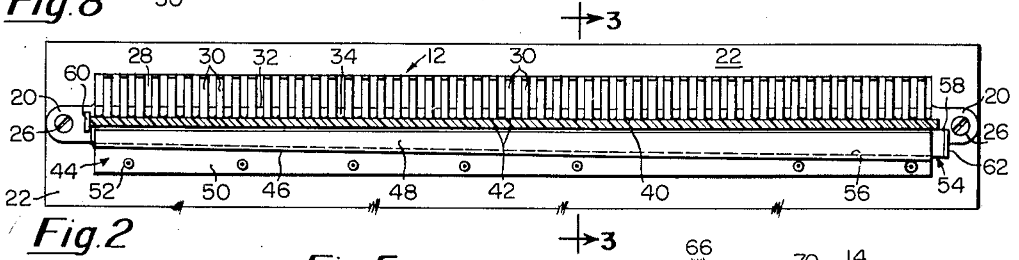
FIG. 2 is a sectional view taken through one of the circuit boards along line 2—2 of FIG. 1 and showing one of the connectors.

As seen in FIG. 2, wall 46 is inclined relative to faces 42 of contacts 30, so that together they form a tapered socket for receiving the printed circuit board 14 and an elongated flat wedge 54 slidably received in guide 44 between flange 48 and panel 18. As seen in that figure, the lower edge 56 of wedge 54 is guided along wall 46 while the upper edge 58 is parallel to contact faces 42.

Figure 5:
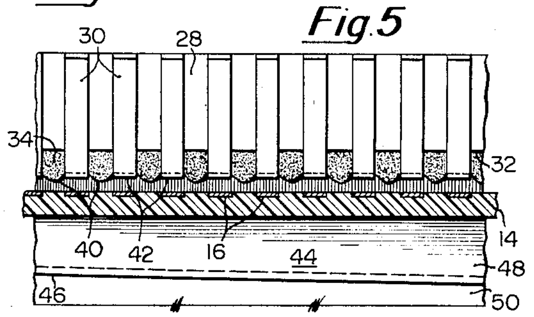
FIG. 5 is a view similar to FIG. 4 but with a wedge member removed and the printed circuit board and connector shown in disconnected condition.

With the wedge 54 withdrawn from guide 44, the printed circuit board 14 is inserted into the connectors 12 between the contact faces 42 and the wedge guide 44 at the rightward end as seen in FIG. 2, or as seen in FIG. 1, in a direction normal to the plane of the drawing from the rear forwardly toward the viewer, and slid along the connectors 12 until it comes against stop members 60 (FIG. 2) fixed to an ear 20 of panels 18. At this point the printed circuit board conductors 16 are in line with contacts 30 as seen in FIG. 5. It is to be noted that the resilient bulges 40 act as anti-contact bumpers so that the operation of inserting or removing the printed circuit board 14 is accomplished without any scuffing, nicking or catching of the board conductors 16 on contacts 30.

Figure 4:
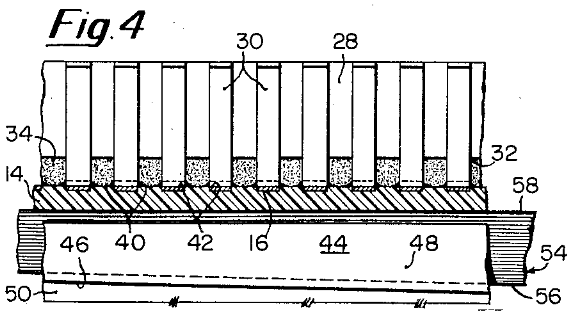
FIG. 4 is an enlarged view of a fragmentary portion of FIG. 2 further illustrating the locking arrangement of the printed circuit board and connector.

With the assembly in the condition of FIG. 5, wedge 54 is inserted between the guide 44 and panel 18 and pushed leftwardly as seen in FIG. 2 to the limit of its movement by means of a finger grip or lug 62 formed laterally on the large end of the wedge. This movement of the wedge forces the printed circuit board 14 in a direction normal to its plane and serves to lock the board to the connector as seen in FIGS. 3 and 4. The locking movement also serves to displace the resilient bulges 40 thereby exposing the contact faces 42 and bringing the latter into conductive contact with the printed circuit board conductors 16 with a high contact force.

Figure 6:
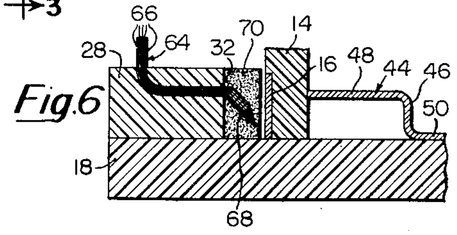
FIGS. 6 and 7 illustrate the preferred form of connector in which the action of locking the circuit board to the connector accomplishes also a wiping contact.
Figure 7:
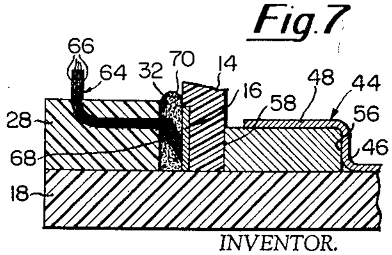

FIGS. 6 and 7 illustrate the preferred form of connector in which a plurality of spaced-apart contacts 64 are each formed of several layers of conductive spring leaves 66. In the disconnected or normal condition of the connector as shown in FIG. 6, the terminal ends 68 of contacts 64 project from the side 32 of the contact supporting bar 28 and are disposed at an angle to the plane of the printed circuit board 14. Also, in this form of connector the resilient means comprise individual bumpers 70 each secured adjacent the side 32 and interposed between a pair of contacts 64 and extending from side 32 a distance slightly greater than the terminal ends 68. Accordingly, when wedge 54 is inserted into the connector to lock the printed circuit board 14 therein in a manner as explained previously, the wedging action produces not only a high contact force between the printed circuit board conductors 16 and the terminal ends 68 but in flexing also provides a wiping contact of the terminal ends 68 against the board conductors 16, as is understood from FIG. 7. Thus in the preferred form of the invention, there is provided a high contact force, a highly desirable wiping action of the contacts, and a more reliable contact due to the multiple spring leaf construction of the contacts.

Figure 8:
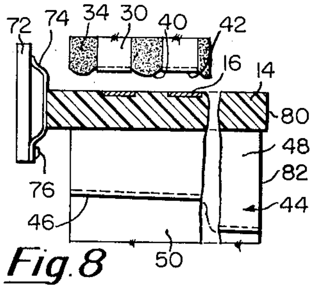
FIGS. 8, 9 and 10 show another modification which also affords a wiping contact.
Figure 9:
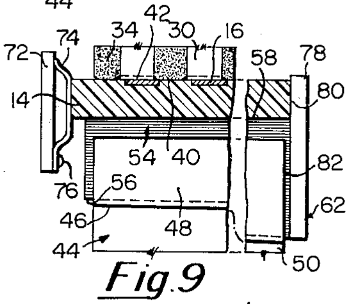
Figure 10:
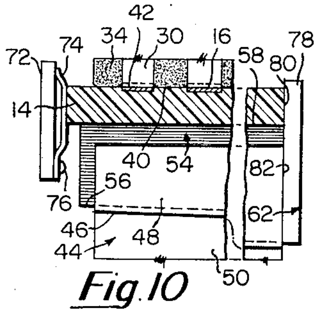

FIGS. 8, 9 and 10 illustrate another alternative form of the invention in which the construction of FIGS. 1 through 5 is adapted also to provide a wiping contact as well as a high contact force. In this modification, the circuit board stop is made yieldable and is illustrated in one form as an anchor strip 72 secured to ear 20 of panel 18 and a formed spring leaf 74 secured at one end to strip 72 as by a screw 76. Lug 62 in wedge 54 is now constructed with an extension 78 which projects above the upper edge 58 of the wedge as seen in FIG. 9.

When the printed circuit board 14 is inserted into the connector it will come against spring leaf 74, as seen in FIG. 8, at which position the end 80 of board 14 will be a short distance away from the end 82 of wedge guide 44, and with the board conductors 16 short of exact alignment with the contacts 30 by an amount substantially equal to such distance. Wedge 54 is then inserted into guide 44 until extension 78 abuts the end 80 of board 14 as shown in FIG. 9. In this position, the board 14 is substantially but not quite completely locked to the connector with a major portion of the board conductors 16 in contact with the contacts 30. Wedge 54 is then pressed further into guide 44 to the limit of its movements from the position of FIG. 9 to the position of FIG. 10 until lug 62 stops against the end 82 of guide 44. By this movement, extension 78 drives board 14 further into the connector against the biasing action of spring leaf 74 while at the same time the board is given an additional component of motion toward the contacts 30 by the wedging action of wedge 54. Thus there is provided a resultant movement of the board and a wiping action of the board conductors 16 against the contacts 30 as they are brought into final alignment as shown in FIG. 10.

It will now be seen that the invention provides an improved electrical connector for convenient and rapid insertion and removal of printed or etched circuit boards, and the like, with means for protecting the board conductors and connector contacts and providing, further, a more efficient and reliable electrical contact.

While there have been disclosed various embodiments of the invention, it is understood that these are specific forms exemplary of the principles of the invention and that the invention may be constructed in a variety of shapes and forms without departing from the true spirit and scope thereof. Accordingly, it is to be understood that the invention is not to be limited by the specific structures disclosed but only by the subjoined claims.

What is claimed is:

1. An electrical connector for use with a circuit board having a plurality of spaced conductors terminating along a margin comprising, an elongated member having a plurality of spaced conductive contacts secured thereto, each contact having a portion disposed adjacent an elongated side of said member, a plurality of resilient bumpers at said elongated side extending from said side a distance somewhat greater than the distance of said contact portions from said side, each resilient bumper extending between adjacent ones of said contact portions and being opposite a space between adjacent ones of said conductors, and means for forcing said board into locking engagement with said member to first displace said resilient bumpers and then bring said terminal portions of said conductors into electrical contact with said contact portions, said resilient bumpers shielding said contact portions to permit insertion of said board into locking position in said connector without contact between said terminal portions of said conductors and said contact portions.

2. An electrical connector as defined in claim 1 characterized further by the inclusion of means comprising, yieldable stop means for pre-positioning said board in said connector in a direction parallel to the plane of said board with said terminal portions of said conductors in substantial but not complete alignment with said contact portions, and wherein operation of said means for forcing said board into locking engagement with said member will move said board in said direction against said stop means and in a direction normal to the plane of said board into said locking engagement.

3. An electrical connector as defined in claim 2 wherein said means for forcing said board into locking engagement with said member comprises, an elongated flat wedge engaging a surface of said board, and an extension on said wedge engaging an end of said board.

4. An electrical connector as defined in claim 1 wherein said means for forcing said board into locking engagement with said member comprises a wedge engaging a surface of said board.

5. An electrical connector as defined in claim 1 wherein operation of said means for forcing said board into locking engagement with said member effects a wiping contact of said conductors with said contact portions in a direction parallel to the longitudinal dimension of said elongated member.

6. An electrical connector for use with a circuit board having a plurality of conductors terminating along a margin comprising, an elongated member having a plurality of conductive contacts secured thereto, each contact comprising several layers of spring leaves and having its terminal contact end projecting from an elongated side of said member at an angle to said board, resilient means at said elongated side extending from said side a distance somewhat greater than the distance of said terminal contact ends from said side, and means operable for forcing said board into locking engagement with said member to displace said resilient means and bring said terminal portions of said conductors into electrical contact with said terminal contact ends.

7. An electrical connector for use with a circuit board having a plurality of conductors terminating along a margin comprising, an elongated member having a plurality of conductive contacts secured thereto, each contact comprising several layers of spring leaves and having its terminal contact end projecting from an elongated side of said member at an angle to said board, resilient means at said elongated side extending from said side a distance somewhat greater than the distance of said terminal contact ends from said side, and wedge means operable for forcing said board in a direction normal to its plane into locking engagement with said member to displace said resilient means and bring said terminal portions of said conductors into wiping electrical contact with said terminal contact ends.

References Cited in the file of this patent

UNITED STATES PATENTS

| | | |
|---|---|---|
| 1,757,822 | Woofter | May 6, 1930 |
| 1,798,375 | Greenwood | Mar. 31, 1931 |
| 2,331,654 | Butler | Oct. 12, 1943 |
| 2,379,942 | Webber | July 10, 1945 |
| 2,730,683 | Ayres et al. | Jan. 10, 1956 |
| 2,731,609 | Sobel | Jan. 17, 1956 |
| 2,748,321 | Kamm | May 29, 1956 |
| 2,857,577 | Vanderpool | Oct. 21, 1958 |
| 2,858,515 | Thunander et al. | Oct. 28, 1958 |
| 2,877,324 | Oshiry | Mar. 10, 1959 |
| 2,881,404 | Kamm | Apr. 7, 1959 |